(12) United States Patent
Ho et al.

(10) Patent No.: US 10,134,990 B2
(45) Date of Patent: Nov. 20, 2018

(54) MULTILAYER HETEROSTRUCTURES FOR APPLICATION IN OLEDS AND PHOTOVOLTAIC DEVICES

(71) Applicant: NATIONAL UNIVERSITY OF SINGAPORE, Singapore (SG)

(72) Inventors: Peter Ho, Singapore (SG); Perq-Jon Chia, Singapore (SG); Lay-Lay Chua, Singapore (SG); Rui-Qi Png, Singapore (SG); Richard Henry Friend, Cambridge (GB)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 0 days.

(21) Appl. No.: 15/493,678

(22) Filed: Apr. 21, 2017

(65) Prior Publication Data

US 2017/0222146 A1 Aug. 3, 2017

Related U.S. Application Data

(62) Division of application No. 14/557,493, filed on Dec. 2, 2014, which is a division of application No. (Continued)

(51) Int. Cl.
*H01L 51/00* (2006.01)
*C09D 165/02* (2006.01)
(Continued)

(52) U.S. Cl.
CPC ............ *H01L 51/0015* (2013.01); *C08J 3/24* (2013.01); *C08J 3/28* (2013.01); *C09D 165/00* (2013.01); *C09D 165/02* (2013.01); *H01L 51/0003* (2013.01); *H01L 51/0012* (2013.01); *H01L 51/426* (2013.01); *H01L 51/4253* (2013.01); *H01L 51/5012* (2013.01); *H01L 51/56* (2013.01); *C08J 2365/00* (2013.01); *C08J 2365/02* (2013.01); *H01L 51/0035* (2013.01); *H01L 51/0036* (2013.01); *H01L 51/0037* (2013.01); *H01L 51/0038* (2013.01);
(Continued)

(58) Field of Classification Search
None
See application file for complete search history.

(56) References Cited

U.S. PATENT DOCUMENTS 6,166,489 A 12/2000 Thompson et al.
7,537,884 B2 5/2009 Hsieh et al.
(Continued)

FOREIGN PATENT DOCUMENTS

EP 0 899 796 3/1999

OTHER PUBLICATIONS

International Search Report for PCT/GB2008/003965, dated Mar. 16, 2009.
(Continued)

*Primary Examiner* — Angel Roman
(74) *Attorney, Agent, or Firm* — Nixon & Vanderhye P.C.

(57) ABSTRACT

This invention relates to a supported polymer heterostructure and methods of manufacture. The heterostructure is suitable for use in a range of applications which require semiconductor devices, including photovoltaic devices and light-emitting diodes.

10 Claims, 3 Drawing Sheets

Related U.S. Application Data

12/744,800, filed as application No. PCT/GB2008/003965 on Nov. 28, 2008, now Pat. No. 8,927,383.

(60) Provisional application No. 60/990,636, filed on Nov. 28, 2007.

(51) Int. Cl.

| | | |
|---|---|---|
| *C09D 165/00* | (2006.01) | |
| *H01L 51/42* | (2006.01) | |
| *H01L 51/50* | (2006.01) | |
| *H01L 51/56* | (2006.01) | |
| *C08J 3/24* | (2006.01) | |
| *C08J 3/28* | (2006.01) | |

(52) U.S. Cl.
CPC ...... *H01L 51/0039* (2013.01); *H01L 51/0043* (2013.01); *H01L 51/0047* (2013.01); *Y02E 10/549* (2013.01); *Y02P 70/521* (2015.11); *Y10T 428/269* (2015.01); *Y10T 428/31504* (2015.04); *Y10T 428/31855* (2015.04); *Y10T 428/31909* (2015.04)

(56) References Cited

U.S. PATENT DOCUMENTS

| | | | |
|---|---|---|---|
| 2002/0166629 A1* | 11/2002 | Caster | B60C 1/00 156/309.3 |
| 2003/0063245 A1* | 4/2003 | Bowley | C09K 19/02 349/115 |
| 2003/0136943 A1 | 7/2003 | Alivisatos et al. | |
| 2004/0131977 A1 | 7/2004 | Martyniuk et al. | |
| 2004/0209448 A1* | 10/2004 | Zhang | H01L 51/0021 438/510 |
| 2005/0098205 A1* | 5/2005 | Roscheisen | B82Y 10/00 136/263 |
| 2005/0156176 A1 | 7/2005 | Gupta et al. | |
| 2005/0158523 A1 | 7/2005 | Gupta et al. | |
| 2006/0057424 A1 | 3/2006 | Chang et al. | |
| 2006/0076050 A1* | 4/2006 | Williams | B82Y 10/00 136/263 |
| 2007/0212528 A1 | 9/2007 | Mackay et al. | |
| 2007/0273276 A1 | 11/2007 | Ottermann et al. | |
| 2008/0213583 A1* | 9/2008 | Noguchi | B32B 27/00 428/355 AC |
| 2009/0233011 A1* | 9/2009 | Suh | G02B 5/0242 428/1.33 |

OTHER PUBLICATIONS

Written Opinion of the International Searching Authority for PCT/GB2008/003965, dated Mar. 16, 2009.
Marsitzky, D. et al., "Amorphous Poly-2,7-fluorene Networks", *Chemistry of Materials*, American Chemical Society, vol. 13, (Oct. 13, 2001), pp. 4285-4289;XP002221867.
Zhang, et al., "Energy level alignment and morphology of interfaces between molecular and polymeric organic semiconductors", *Organic Electronics*, vol. 8, No. 5, (Sep. 26, 2007), pp. 606-614.
Voigt, M. et al., "The interplay between the optical and electronic properties of light-emitting-diode applicable conjugated polymer blends and their phase-separated morphology", *Organic Electronics*, vol. 6, No. 1, (Feb. 1, 2005), pp. 35-45.
Böltau, M. et al., "Surface-induced structure formation of polymer blends on patterned substrates", *Nature*, Nature Publishing Group, London, UK, vol. 391, No. 6670, (Feb. 26, 1998), pp. 877-879; XP002118826.
Coffey, G., "Patterning Phase Separation in Polymer Films with Dip-Pen Nanolithography", *Journal of the American Chemical Society*, vol. 127, (2005), pp. 4564-4565.
International Preliminary Report on Patentability dated Jun. 2, 2010 in PCT/GB2008/003965.
Edmondson et al, "Quasi-2D Polymer Objects from Patterned, Crosslinked Polymer Brushes," *Adv. Mater.*, 2004 15(15), 1327-1331.
Olson et al, Templating Nanoporous Polymers with Ordered Block Copolymers, *Chem. Mater.*, 2008, 20, 869-890.
Mingqi Li et al, "Block copolymer patterns and templates," *Materials Today*, 2006, 9(9), 30-39.
Hamley, "Nanostructure fabrication using block copolymers," *Nanotechnology*, 2003, 14 R39-R54.
Friend et al, "Electroluminescence in conjugated polymers," *Nature*, 1999, 397, 121-128.
Snaith et al, "Charge Generation Kinetics and Transport Mechanisms in Blended Polyfluorene Photovoltaic Devices," *Nano Lett*, 2002, 2, 1353-1357.
Indian Office Action issued in Appln. No. 1354/MUMNP/2010 dated May 17, 2017.

* cited by examiner

MULTILAYER HETEROSTRUCTURES FOR APPLICATION IN OLEDS AND PHOTOVOLTAIC DEVICES

This application is a divisional of application Ser. No. 14/557,493, filed Dec. 2, 2014, which is a divisional of application Ser. No. 12/744,800 filed Jan. 11, 2011, now U.S. Pat. No. 8,927,383, which in turn is the U.S. national phase of International Application No. PCT/GB2008/003965 filed Nov. 28, 2008, which claims the benefit of U.S. Provisional No. 60/990,636 filed Nov. 28, 2007, the entire contents of each of which are hereby incorporated by reference.

FIELD OF THE INVENTION

The present invention relates to the field of polymer thin film technology and devices such as organic electronic devices, plastic electronic devices and organic semiconductor devices. In particular, it concerns organic polymer heterostructures, e.g. organic polymer solvent-processable heterostructures which may contain one or more diffuse or abrupt interfaces. The heterostructures may be nanostructured. The heterostructures may comprise a crosslinkable material. The present invention also relates to methods of making said heterostructures.

BACKGROUND OF THE INVENTION

High-quality semiconductor heterostructures, which are junctions of two dissimilar materials in contact, are crucial to the proper operation of many organic semiconductor devices, including light-emitting diodes and photovoltaics. The materials in contact may differ in one or more of the following opto-electronic properties: the hole and electron transport levels, refractive indices, excited state energy levels.

By selecting the appropriate materials which are in contact, one can form e.g., a charge-confinement interface which transmits carriers of one sign but blocks carriers of the opposite sign. This may be achieved by adopting at least one of the following: the appropriate energy offsets in the hole and electron transport levels; a charge-injecting interface for efficient injection of charge of one sign by having a graded energy level; an exciton-confinement interface to prevent the exciton from wandering into the neighbouring layer by imposing a higher energy there; a photon-confinement interface that prevents photons from travelling away into the neighbouring layer by imposing the condition for total internal reflection at the interface; a charge-carrier-generation interface to create electrons and holes upon absorption of a photon by having the suitable offsets in both the electron and hole energy levels for exciton dissociation; a cascaded set of energy levels for these electrons and holes for even more efficient charge-carrier generation; or a charge-carrier-recombination interface to create excitons by the capture of electrons and holes electrically injected into the device by having the suitable offsets in both the electron and hole energy levels for exciton generation.

An organic light emitting diode (OLED) consists of a cathode, an emissive layer, and an anode in a sandwich structure. The anode usually consists of a transparent indium tin oxide (ITO) substrate coated with a layer of conducting polymer. The emissive layer consists of electron transporting, hole transporting and emissive materials. These materials may be molecules, oligomers or polymers or segments of polymers, or nanocrystals, or nanowires and nanosheets, with a $\square$-$\square$* gap of 1-4 electronvolts (eV). The cathode usually consists of a low work function material such as calcium, or a combination of an insulator such as lithium fluoride and a metal such as aluminium.

When a negative bias is applied to the cathode and is larger than the built-in potential, electrons are injected into the electron transporting material, while holes are injected into the hole transporting material. The electron transporting and hole transporting materials may be the same or different. The electrons are transported into the lowest unoccupied molecular orbital (LUMO) of the emissive material, and holes are transported into the highest occupied molecular orbital (HOMO) of the emissive material. The recombination of these electrons and holes gives a photon with energy corresponding to the LUMO-HOMO gap.

An organic photovoltaic (OPV) device consists of an electron collector (cathode), an absorption and charge-generating layer and a hole collector (anode). The electron collector usually consists of a low work function material such as calcium or aluminium. The absorption and charge-generation layer consists of absorbing materials that absorb the light to give an exciton state, charge dissociation materials that dissociate this exciton state to give the electron and hole, and charge transporting materials that transport the electrons and holes away from the dissociation sites. These materials may be the same or different. They may be molecules, oligomers or polymers or segments of polymers, or nanocrystals or nanowires or nanosheets, with a $\square$-$\square$* gap of 1-4 electronvolts (eV).

Upon absorption of a photon with energy similar to the absorption gap of the organic material, an exciton is formed. Excitons are coulombically-bound electron-hole pairs. Excitons need to be separated into electrons and holes, and collected at the cathode and anode respectively. The efficiency of separation of these photo-excited excitons into free electrons and holes is therefore critical to the efficiency of OPVs. This separation is achieved at the interface between two materials with appropriate energy offsets in both the LUMO and HOMO levels and is crucial for the efficient dissociation of the excitons to provide efficient OPVs. One of these materials is a hole transporting material, and the other is an electron transporting material. Holes and electrons are therefore respectively transported through these materials to the respective electrodes to be collected.

For a number of applications, particularly for charge-carrier-recombination in light-emitting devices, and for charge-carrier-generation in photovoltaics, it is desirable to have a distributed heterostructure, as opposed to a planar heterostructure. A planar heterostructure is flat. A distributed heterostructure creates a large interfacial area between the two materials in contact, by having "fingers" of one material in contact with the other material or one material embedded in the other, so that the two or more materials are in intimate contact. Having a large heterostructure interfacial area can improve e.g., charge-carrier generation efficiency in photovoltaic devices.

It is further desirable for the two charge-conducting materials that continuous paths exist between all locations in the hole transporting material to its proper contact (positively-biased contact for injection of holes in light-emitting diodes and negatively-biased contact for collection of holes in photovoltaics), and likewise for the electron transporting material. In addition, such paths should preferentially lie along the most direct route; otherwise the transport of these carriers would be obstructed, and the resistance of the device increases undesirably.

Therefore, for these applications, the heterostructure not only has to have a large surface area but its morphology should ideally be columnar (i.e., the shapes, such as either voids or columns, pass through the thickness of the film), which may be referred to herein as the "columnar distributed heterostructure". Columnar distributed heterostructures are widely expected to be beneficial, but so far their fabrication has proved problematic. Controlling the morphology of such structures during formation is not straightforward.

In particular, for organic photovoltaic devices, the required lateral dimensions of the heterostructure in the directions along the plane of the film (i.e., the lateral length scale of the distributed heterostructure) is related to the exciton diffusion length scale. Absorption of light creates an exciton that diffuses about in the material. It is essential that this exciton can reach the charge-carrier-generating interface within its lifetime, in order to produce electrons and holes that can be separated. For typical exciton diffusion length scales of a few to tens of nanometers, it is useful to have the lateral length scale of similar dimensions, so that the majority of the excitons generated can reach the dissociation interface. With the charge-carriers so created, it is then essential for them to be transported to the respective collection electrodes. Up till now, it has proven difficult to fabricate such heterostructures of such fineness in a suitable morphology. It is one of the objectives of this invention to provide ways to achieve this without resorting to use of an electron beam or other lithographic methods.

It has been shown by Friend and co-workers (Nano. Lett. 2002, 2, 1353-1357), and others, that when two semiconducting polymers are co-dissolved in a common solvent, and the mixture deposited to give a film by spin-coating or ink jet printing, the film formed will be naturally phase-separated. The character and length scale of the phase separation depends amongst other factors on the solvent and its evaporation rate (influenced e.g., by heating or the presence of a high vapor pressure of the solvent). These are useful parameters in providing a degree of control over the phase separation length scale and morphology, and hence of the distributed heterostructure, which has been shown to be useful for photovoltaic applications.

The typical phase separation length scale is of the order of a few micrometers to tens of micrometers. Although the solvent and its evaporation rate can influence this somewhat, it is ultimately strongly related to the character of the polymers. Very fine heterostructures below 1 micron in lateral length scale cannot readily be expected, particularly if the polymers are sufficiently incompatible that they phase separate out early in the solution drying process. In this manner, a hierarchy of phase separation occurs in both the lateral and vertical dimensions, possibly forming isolated phases within the polymer thin film, which often leads to a so-called "Russian doll" morphology in which material A for example is completely occluded in material B.

As a result, the connectivity is broken; holes, for example, cannot flow out of the occluded phases of the hole-conducting material. Furthermore, it is possible for certain polymers to develop "wetting" layers so that they may form a partial or complete overlayer or underlayer at the interfaces of the polymer thin film but not necessarily in the most desirable way. In the context of photovoltaic devices, this will mean that a significant fraction of the charges generated within these phases cannot successfully reach the electrodes, thereby limiting the efficiency of the photovoltaic devices.

It has also been shown by Steiner and co-workers (Nature, 1998, 391, 877-879) that the phase separation of polymer blends can be spatially influenced and directed by patterns pre-formed on the substrate. Such patterns include patterns in the surface energy, created e.g. by chemical reaction through a pattern-generating method such as contact printing, or by photolithography. It has further been shown that polymer blends have preferred phase-separation length scales of the order of a few to tens of microns, and application of the phase-separation pattern to the underlying chemical pattern is not possible if the length scales are very different. These methods require the formation of a chemical pre-pattern on the substrate, and then phase separation of the desired polymer combination over the pattern.

Bulk distributed heterostructures are known in the art and are used in polymer-based photovoltaic devices. Bulk distributed heterostructures can be made by the natural phase separation of the desired final polymers. In such heterostructures, the phases are not continuous from one electrode to the other. Phase occlusions and polymer wetting layers invariably occur during such phase separation and lead to trapping of the charge carriers, and hence less efficient light-emitting diodes and photovoltaic diodes. Furthermore, the control of length scales of the phase separation within a bulk distributed heterostructure is limited (sub-micrometer length scales are difficult to obtain) and is dependent on the phase separation of the polymers.

These two approaches to generate micron-scale heterostructures in polymer thin films do not provide enough control to form polymer heterostructures with the desired composition profile at will in both the lateral and vertical directions. These approaches tend to lead to the formation of occluded phases and wetting layers that are not always desirable.

A desirable morphology that cannot be readily formed, for example, is a columnar nanostructure in which the desired charge-dissociation materials, and electron transporting and hole transporting materials are arranged appropriately in close proximity laterally, which is immensely beneficial for OPVs. Similarly, a columnar nanostructure in which the desired emissive material, and electron transporting and hole transporting materials are arranged appropriately in close proximity laterally can be useful for OLEDs. Developing a method that can control the variation (or modulation) of the lateral composition profile of the materials is hence desirable.

Another desired morphology is the graded composition profile in the vertical direction. A graded composition profile is one in which the composition of the materials varies systematically in the film thickness direction, from being rich in material A at the bottom face, to being poor in material A at the top face. The top face could further be bound by a film of pure material B. In other words, the heterostructure interface becomes diffuse with respect to materials A and B. This morphology could be useful, for example, for OPVs in which the electron transport material is graded into the hole transport material. Such a vertical variation in composition may be considered as another form of modulated composition. Therefore, it is an objective of this invention to provide heterostructures with such modulated composition profiles, a method of making them, and devices incorporating them.

It is also an objective of this invention to create organic polymer semiconductor heterostructures on the sub-micron scale suitable for use in semiconductor devices, e.g. photovoltaic devices and light-emitting diodes, which are at least as, and preferably more efficient than, existing polymer heterostructures and which preferably exhibit improved performance.

Further objectives of this invention include: (1) the creation of organic solvent-processable heterostructures with one or more diffuse or abrupt interface; (2) the creation of abrupt nanostructures of controlled vertical and horizontal dimensions; (3) the creation of multi-layer polymer heterostructures with high aspect ratios; (4) the creation of tall polymer nanostructures that are self-organized with respect to the underlying nanotemplates; and (5) new methods for making the structures.

SUMMARY OF THE INVENTION

According to a first aspect of the invention, there is provided a supported polymer heterostructure, comprising a polymer immobilized on a substrate and a second material deposited on said polymer.

The supported polymer heterostructure may provide a modulated composition profile. For example, the modulated composition may be an in-plane columnar heterostructure, a vertically graded profile or an in-plane columnar heterostructure with a vertically graded profile.

The polymer heterostructure may be formed using one or more solvents. For example, the polymer heterostructure may be processable with an organic solvent.

The polymer may be an organic polymer. The polymer may be immobilized on the substrate by crosslinking.

The heterostructure, e.g. organic solvent-processable heterostructure may contain one or more diffuse or abrupt interfaces, wherein the heterostructure may be nanostructured, and at least one of the materials in the formation of the heterostructure can be crosslinked.

The heterostructure may be nanostructured, for example it may be in-plane nanostructured. The in-plane nanostructured heterostructure may comprise a series of discrete regularly or randomly spaced elevations or regions of immobilised polymer. The elevations or regions may be referred to as columns. The nanostructure may comprise a columnar or vertical lamellar or be of a mixed morphology.

The nanostructured elevations may have an average lateral distance space (i.e. the lateral length scale) from about 10 nm to about 1000 nm. The nanostructured elevations may have a lateral length scale from about 10 nm to about 300 nm, for example from about 10 nm to about 200 nm. The nanostructured elevations may have a lateral length scale from about 20 nm to about 1000 nm. The nanostructured elevations may have a lateral length scale from about 20 nm to about 200 nm.

The lateral length scale refers to the average distance from one elevation to an adjacent elevation. This distance includes the total width of an elevation and the void between said elevation and an adjacent elevation. The lateral length scale may be selected depending on the nature of the device in which the heterostructure is incorporated.

For example, in OPVs, this length scale may be given approximately by twice the exciton diffusion length, which is the distance over which the exciton has a half probability of decaying back to the ground state. This length scale may be in the range of from about 10 nm to about 50 nm.

For OLEDs, this length scale may be given approximately by the Coulomb capture radius, which is the distance at which the electron and hole interact with an electrostatic energy greater than the thermal energy. This length scale may be in the range of from about 30 nm to about 50 nm.

The elevations may have a height from about 50 nm to about 500 nm. The elevations may have a height from about 50 nm to about 200 nm.

The desired elevation height may be selected depending on the nature of the device in which the heterostructure is incorporated. For OPVs, this may be given approximately by the thickness required to absorb the incoming light. For OLEDs, this may be given approximately by the thickness required for efficient recombination of the electrons and holes. For both OPV and OLED applications, the height is typically in the range of from about 50 nm to about 200 nm.

The nanostructure may be formed by phase separation. The phase separation may be controlled by a phase control material. The phase control material may be a low molecular weight polymer, oligomer, or polyelectrolyte or ionomer.

In one embodiment, the heterostructure is nanostructured wherein the lateral length-scale is sub-0.1 µm with aspect ratio (height to width ratio) approaching or exceeding 1. The aspect ratio may be about or greater than 1.

The nanostructure may be formed by phase separation of a two polymer-one solvent system wherein the phase separation is dependent on the extent of miscibility between the two polymers, or the level of entropy of mixing between the two polymers. A low entropy of mixing between the polymers indicates that the polymers will phase separate. The polymer that is used to direct the phase separation and which is not incorporated into the final heterostructure may be referred to as a phase control material.

The nanostructure may be formed by phase separation of a one polymer-two liquid system, for example a one polymer-two solvent system wherein one solvent has low entropy to the polymer i.e. is a poor solvent or non-solvent which does not dissolve the polymer. The poor solvent or non-solvent may be referred to as a phase control material and may comprise any polar aprotic solvent or a high-boiling point alcohol which does not dissolve the polymer.

The nanostructure may be formed by nano-imprinting of the first polymer.

One of the materials may be crosslinked by means of radiative or thermal crosslinking methodologies.

The composition profile of the interface formed at the polymer and second material may be graded over a vertical distance of from about 5 nm to about 500 nm. The grading may comprise 80-100% of the first polymer and 0-20% of the further material at the surface nearest the substrate to 80-100% of the further material and 0-20% of the first polymer at the opposite face of the heterostructure.

The heterostructure may further comprise one or more inorganic components. The one or more inorganic components may be solvent processable.

There is provided, in a second aspect a method of making a supported heterostructure comprising an abrupt or diffuse interface, the method comprising or including the steps of:
 (i) depositing on a substrate a first material together with a phase control material to effect a phase separation between the first material and the phase control material;
 (ii) removal of the phase control material by a selective solvent or by evaporation;
 (iii) crosslinking the remaining deposited first material; and
 (iv) deposition of a further material on at least the deposited first material.

The first material may be a polymer. The phase control material may be a polymer. The phase control material may act as a sacrificial host. The first material and the phase control material may be deposited in a two polymer and one solvent system.

The phase control material may be a low molecular weight polymer, oligomer, or polyelectrolyte or ionomer.

The phase control material may be selectively removed using a selective or discriminating solvent which solubilizes the phase control material but not the first material.

The steps (i), (ii) and (iii) may be repeated at least once before step (iv). The method may further comprise use of a subsequent phase separation step employing the same two polymer and one solvent system to build up tall features with high aspect ratios.

The further material may be crosslinked.

The first material may be a polymer. The phase control material may be a solvent. The first material and the phase control material may be deposited in a one polymer and two solvent system.

The phase control material may be a poor solvent or non-solvent, with low entropy to the polymer. The solvent may comprise any polar aprotic solvent or a high-boiling point alcohol which does not dissolve the polymer.

The method may further comprise use of a subsequent phase separation step employing the same one polymer and two solvent system to build up tall features with high aspect ratios.

By depositing the further material over the crosslinked polymer in a back-filling process, a composite heterostructure that is both vertically layered and also in-plane nanostructured may be obtained.

In one embodiment of the second aspect, the subsequent phase separation is self-aligned to the first determined pattern.

The further material may comprise a material with a lower molecular weight than the molecular weight of the polymer. Suitable materials may include oligomers or small molecules.

According to a third aspect of the invention, there is provided a method of making a supported heterostructure comprising a diffuse interface, the method comprising or including the steps of:
  (i) depositing onto a substrate a first polymer;
  (ii) crosslinking the polymer; and
  (iii) depositing onto the first polymer a further material with lower molecular weight than the molecular weight of the first polymer, wherein the further material diffuses into the first polymer to form the diffuse interface.

In (iii), the further material may be nanocrystals or nanowires. The molecular weight of the nanocrystals or nanowires may be lower than or higher than the molecular weight of the first polymer.

The composition profile of the interface may be graded over a vertical distance of from about 5 nm to about 500 nm. The grading may comprise 80-100% of the first polymer and 0-20% of the further material at the surface nearest the substrate to 80-100% of the further material and 0-20% of the first polymer at the opposite face of the hetero structure.

The heterostructure may comprise a vertical lamellar structure.

In one embodiment of the third aspect, the lower molecular weight materials are oligomers of organic semiconducting materials with appropriate band gap and/or charge-transport levels, such as thiophene, phenylene, fluorene, oxadiazole.

In another embodiment of the third aspect, the lower molecular weight materials are small molecules with the appropriate band gap and/or charge-transport levels such as fullerene and its derivatives, and phthalocyanine.

In another embodiment of the third aspect, the lower molecular weight materials may be nanocrystals and nanowires of inorganic materials with the appropriate band gap and/or charge-transport levels, such as metal oxides or Group II-VI compounds.

The band gap may be from about 1 eV to about 4 eV. The nanocrystals or nanowires may comprise a conduction band edge in the range of from about 4.5 eV to about 2.5 eV and a valence band edge in the range of from about 5.5 eV to about 7.5 eV.

In another embodiment of the third aspect, the lower molecular weight materials are polymers with a degree of polymerisation between 2 to 10.

The substrate may be an electrode. Alternatively, an electrode may be deposited on the substrate. The substrate or electrode may be pre-patterned prior to the first deposition. The pre-pattern may be applied by surface-energy patterning or chemical patterning using photolithography, contact printing, or by in-plane phase separation of a block polymer.

According to a fourth aspect of the invention, there is provided a device made using the heterostructure according to the first aspect.

According to a fifth aspect of the invention, there are provided methods of fabricating semiconductor devices, e.g. a semiconductor device, e.g. a photovoltaic device or a light emitting diode, comprising the methods of the second and third aspects of the invention.

The device according to the fourth and fifth aspects may be a photovoltaic device or a light-emitting diode.

For each of the various aspects of the invention, the polymers may be selected from classes of polymers such as poly(thiophenes), for example poly(alkylthiophenes) and copolymers thereof, poly(phenylene vinylenes) and copolymers thereof, poly(fluorenes), for example poly(octylfluorenes) and copolymers thereof, poly(alkylacrylates), polystyrene, poly(methyl methacrylate) and polyaniline.

For each of the various aspects of the invention the organic solvents may be selected from classes of alcohols, esters, water, alkanes, and benzenes.

For each of the various aspects of the invention, the substrate may be selected from any suitable planar substrate such as inorganic metal or semiconductor wafers, glass and plastics.

In another embodiment of the second, third aspects, the deposition of the materials is by ink jet printing, nano-imprinting or spin-coating.

DETAILED DESCRIPTION OF THE INVENTION

Substrates

Suitable substrates for use in the present invention, including the methods, include any planar substrates such as metal or semiconductor (e.g. inorganic) wafers, glass and plastics.

The substrate may be pre-patterned to further direct and enhance phase separation. One example of in-plane phase separation pre-patterning uses PMMA-co-PAAH di-block polymers. For example, a solution of poly(methylmethacrylate)-co-poly(acrylic acid) (PMMA-co-PAAH) is deposited onto a substrate, and phase separates to give columns of PAAH approximately 12 nm in diameter embedded in a PMMA matrix of width 20 nm. Ion exchange of the PAAH with an alkali metal ion, for example, $Na^+$ to give a PAANa block which is insoluble in alcohols.

Irradiation at 254 nm followed by washing with isopropanol photolyses the PMMA block and removes the degraded polymer, leaving the hydrophilic, ionic, PAANa on the surface. This allows the deposition of the first polymer.

The first polymer may be cross-linked and rendered insoluble before removal of the PAANa. A further material may then subsequently be deposited.

By choosing the length scale and morphology of the underlying pre-pattern, the in-plane nanostructure of the final heterostructure can be further controlled.

Polymers

Classes of polymers which may be used as the first polymer in the present invention, including the methods according to the present invention, include those with the lowest unoccupied molecular orbital (LUMO) in the range of from about 1.9 eV to about 3.7 eV and the highest occupied molecular orbital (HOMO) in the range of from about 4.8 eV to about 6.2 eV. Classes of such polymers include poly(thiophenes) and copolymers thereof, poly(phenylene vinylenes) and copolymers thereof, poly(fluorenes) and copolymers thereof, and polyaniline. These may be used as electron acceptors and hole acceptors. Examples of polymers suitable for use in the present invention include but are not limited to poly(octylfluorenes) such as poly(9,9'-dioctylfluorene-co-bis-N,N'-(4-butylphenyl)-bis-N,N'-phenyl-1,4-phenylene-diamine), poly((9,9'-dioctylfluorene)-alt-(benzothiadiazole)) and [2-methoxy-5-(3',7'-dimethyloctyloxy)]-p-phenylenevinylene, poly((9.9-dioctylfluorene)-2,7-diyl-alt-[4,7-bis(3-hexylthien-5-yl)-2,1,3-benzothiadiazole]-2',2"-diyl) and poly(alkylthiophenes) such as poly(3-hexylthiophene).

Polymer Immobilization

The polymer may be immobilized by crosslinking. Crosslinking used in accordance with the present invention, including the methods of the present invention, may be radiative or thermal. Where the polymer does not contain functional groups which allow crosslinking, the polymer may be admixed with a suitable crosslinking agent.

The Further Material

If the immobilized polymer is selected to be the electron transporting component of the device then the further material may comprise a material which may be used as a hole transporting material. Conversely, if the immobilized polymer is selected to be the hole transporting component of the device then the further material may comprise a material which may be used as an electron transporting material.

The further material may comprise any polymer known to be effective as a hole transporting material or as an electron transporting material.

The further material may comprise a material with a lower molecular weight than the molecular weight of the polymer. Suitable materials may include oligomers or small molecules.

Classes of oligomers which are suitable for use in the methods to create diffuse interfaces include, but are not limited to, oligomers of thiophene, phenylene, fluorene, oxadiazole.

Classes of small molecules used in the methods to create diffuse interfaces include, for example, fullerene and its derivatives, and phthalocyanine. One example of a fullerene derivative is (6,6)-phenyl $C_{61}$ butyric acid methyl ester.

Phase Control Material

Examples of materials suitable for use as phase control materials include low molecular weight polymers, oligomers, polyelectrolytes or ionomers, and also any solvent which does not dissolve the polymer which is to form the nanostructure. The low molecular weight polymers may be selected from polymer families such as poly(alkylacrylates), polystyrene or poly(methyl methacrylate).

Preferred solvents for use as phase control materials include any polar aprotic solvent or a high-boiling point alcohol which does not dissolve the polymer. One example of a polar aprotic solvent suitable for use in the present invention is N,N-dimethylformamide. Suitable alcohols include but are not limited to pentanol or ethylene glycol.

Methodologies

The method for forming a heterostructure, e.g. a columnar distributed heterostructure in accordance with the present invention may involve (i) use of a sacrificial "phase control" material which is removed after the phase-separation step to leave a pattern generated in one desired material, (ii) crosslinking of the material in the pattern generated, (iii) optionally, use of this generated pattern as the template for a subsequent phase separation step still employing the first material, which can be repeated, to build up tall high-aspect-ratio features, (iv) the deposition of a second material over the pattern, (v) optionally, crosslinking of the second material, and (vi) optionally, depositing a third material over the second, which can be repeated.

The nature of the second material may determine whether a heterostructure with an abrupt or diffuse interface is formed between the two materials. The term diffuse interface is well known in the art and refers to an interface at which the components on opposite sides of the interface are compositionally graded on a length scale greater than molecular dimensions. The term abrupt interface is also well known in the art and is one in which the components on opposite sides of the interface form a molecularly distinct junction.

The present inventors have found approaches to create polymer nanostructures with a range of phase separation length scales. These include phase separation in which the intended phase is phase separated and connected directly to the intended electrode. This has a direct impact on the transport of charge carriers as all charges have a clear path to or from its electrode.

In a two polymer one solvent system, a sacrificial host polymer (denoted polymer B) acts as the phase control material and is phase separated with the first material (denoted polymer A). Polymer B is removed by a discriminating solvent, leaving polymer A intact. A discriminating solvent is a solvent which selectively dissolves Polymer B while not dissolving polymer A.

Polymer A can be crosslinked using crosslinking methodologies to render it insoluble for subsequent processing. Crosslinking of polymers may occur upon exposure to radiation, for example UV radiation, or upon thermal processing.

In the context of, for example, organic photovoltaic devices and organic light-emitting diodes, a suitable polymer C can be deposited subsequently to complete the nano-heterostructure devices.

The present inventors have also found a way to build polymer nanostructures of high aspect ratios by a layer-by-layer approach. The first phase separated nanostructure layer acts as a nanotemplate on which subsequent layers can self-organize, creating high aspect ratio nanostructures. A suitable polymer C can be deposited subsequently to complete a semiconductor device such as either an organic photovoltaic or organic light-emitting diode device.

If polymer A is selected to be the electron transporting component of the device then polymer C may comprise a polymer which may be used as a hole transporting material. Conversely, if polymer A is selected to be the hole transporting component of the device then polymer C may comprise a polymer which may be used as an electron transporting material.

Besides utilizing the two polymer plus one solvent approach in the preceding paragraph, the present inventors have also found that polymer columnar distributed heterostructures can be created using a one polymer plus two solvent method.

In a one polymer plus one solvent system, the polymer will dissolve in the solvent if the system has high enough entropy. Upon solution processing of a one polymer dissolved in a one solvent system, the solvent will evaporate and the polymer will be left behind.

A solvent with low entropy with the polymer (hence does not dissolve the polymer) and higher vapor pressure than the solvent that is able to dissolve the polymer can be mixed together in a one polymer plus two solvent system assuming that the two solvents are miscible.

Upon solution processing, the solvent that dissolves the polymer will evaporate first, leaving behind the solvent with low entropy with the polymer, hence the solvent will phase separate with the polymer. When the second solvent dries, the polymer left will have nanostructures left behind by the solvent.

The method for forming a diffuse interface in a vertical heterostructure may involve the following steps: (i) deposition of a first material; (ii) crosslinking of the first material; (iii) deposition of a second material which can infiltrate or diffuse into the first material.

Here we have found methods to diffuse or infiltrate material into the polymer system with a range of materials. As a first step, this may include depositing of a first material, for example, a polymer (A) onto the intended electrode. This has a direct impact on the transport of charge carriers as all charges have a clear path to or from the electrode. Polymer A can be crosslinked using crosslinking methodologies to render it insoluble for subsequent processing. In the context of organic photovoltaic and organic light-emitting diode devices, a suitable material can be subsequently deposited to complete the nano-heterostructure devices.

Deposition of materials may be achieved by contact printing, spin-coating, ink-jet printing or other solution methods known in the art.

Classes of solvents which are suitable for use in the methods include alcohols, esters, water, alkanes, and benzenes.

Nanostructures

In the present invention, the morphology of the nanostructured heterostructure may be controlled by use of phase control materials as outlined previously. Deposition of a polymer and a phase control material, followed by phase separation of the polymer and the phase control material and subsequent removal of the phase control material may result in a series of discrete elevations, or columns, of polymer on a first surface of the substrate and separated by voids left by the phase control material.

Upon deposition of a further material, the voids may be backfilled by the further material, resulting in a supported heterostructure comprising alternate regions of the polymer and the further material. For the heterostructure to be suitable for use in a semi-conducting device, the deposition or backfilling may be such that the discrete elevations of the polymer on the substrate are substantially or completely encapsulated by the further material.

The lateral direction referred to herein runs parallel to or substantially parallel to the first surface of the substrate. The height or thickness of the elevations refers to the dimension which is perpendicular to or substantially perpendicular to the plane of the substrate.

Uses of the Organic Polymer Nanoscale Heterostructures

The methodologies described herein outline the formation of organic polymer nanoscale heterostructures. Such heterostructures are suitable for use in the fabrication of polymer organic semiconductor devices such as organic light emitting diode devices or organic photovoltaic devices.

In the construction of such devices, the polymer in question (Polymer A) may be deposited onto a substrate or an electrode. The electrode may also be pre-patterned by methods known in the art, for example, surface-energy patterning or chemical patterning using photolithography, contact printing or in-plane phase separation of a block polymer. Following formation of the heterostructure, a second electrode may be deposited onto the opposite surface of the heterostructure to the first electrode to complete fabrication of the device.

The anode may be formed from a transparent layer of Indium Tin Oxide coated with a layer of conducting poly (3,4-ethylenedioxythiophene) doped with poly(styrenesulfonate). The cathode, usually a metal with a low work function such as calcium, aluminium or magnesium, may be deposited by thermal or electron beam evaporation of the metal.

BRIEF DESCRIPTION OF THE DRAWINGS

Embodiments of the invention will now be described, by way of example only and without limitation, with reference to the accompanying drawings and the following Examples, in which:

With reference to FIG. 1, a solution (1) comprising a first polymer and a phase control material is deposited onto a substrate (2). Phase separation into distinct phases of polymer (3) and phase control material (4) then occurs. In a third step, the phase control material (4) can be selectively removed through use of a solvent which dissolves the phase control material (4) but does not dissolve the first polymer (3) or in the case of the phase control material being a solvent, by evaporation, leaving behind a series of voids and nanostructured elevations of polymer (3), which may then be immobilized by crosslinking. As a fourth step, deposition of a second material (5) onto the first polymer (3) completes fabrication of the heterostructure.

Figure 1A:
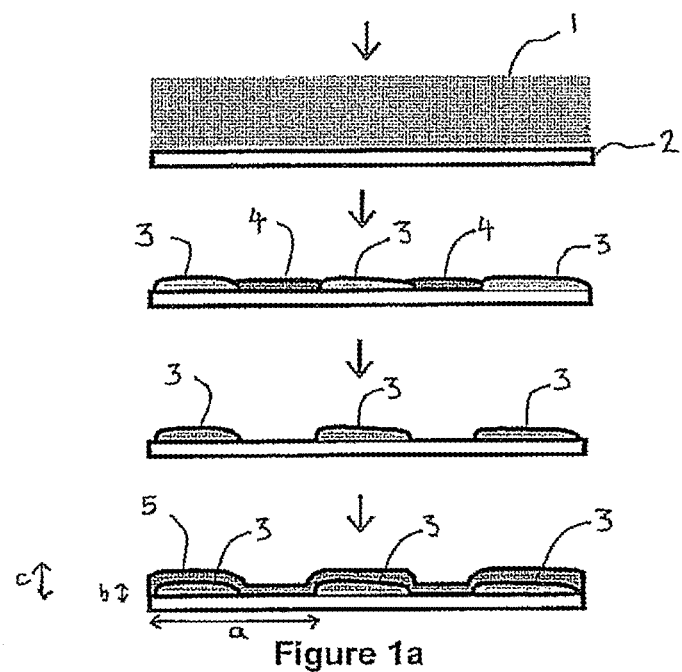
FIGS. 1a and 1b describe general schemes for the formation of nanoscale heterostructures in accordance with the present invention.
Figure 1B:
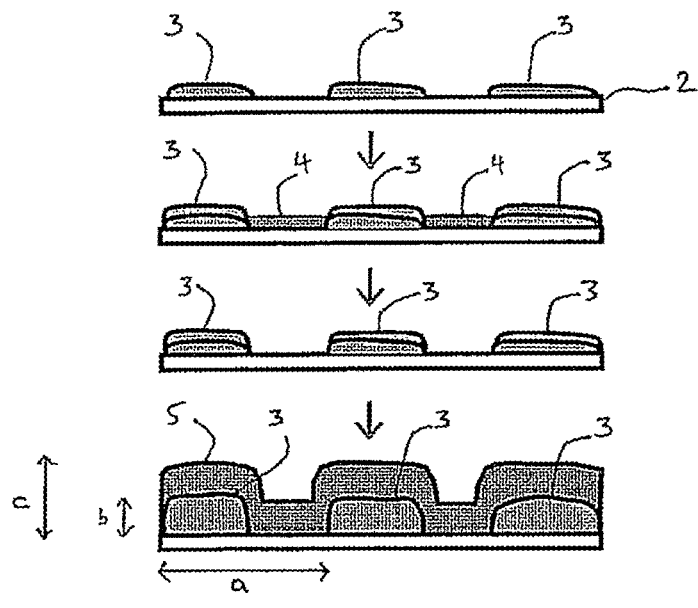

In order to increase the height of the nanostructure, crosslinked polymer (3), immobilized on substrate (2), may undergo a subsequent deposition of solution (1) using the first layer as a template, as shown in FIG. 1b. This intermediate structure would then be processed as before: selective removal of phase control material (4) followed by crosslinking, and deposition of a second material (5) to back-fill into first polymer (3).

As shown in FIG. 1, the deposition of the second material (5) may be such that it completely or substantially encapsulates the first polymer (3) upon the substrate (2). The steps of (i) deposition of the first polymer (3) and phase control material (4) and (ii) removal of the phase control material (4) and crosslinking of the first polymer (3) may be repeated as many times as is necessary, depending on the required morphology of the heterostructure.

Dimension (a) in FIG. 1 refers to the lateral length scale of the elevations of deposited polymer. For convenience, this is indicated as being the sum of the width of one elevation and the width of the neighbouring void. Dimension (b) refers to the height or thickness of the elevations. Dimension (c) refers to the total height or thickness of the supported heterostructure.

Figure 2:
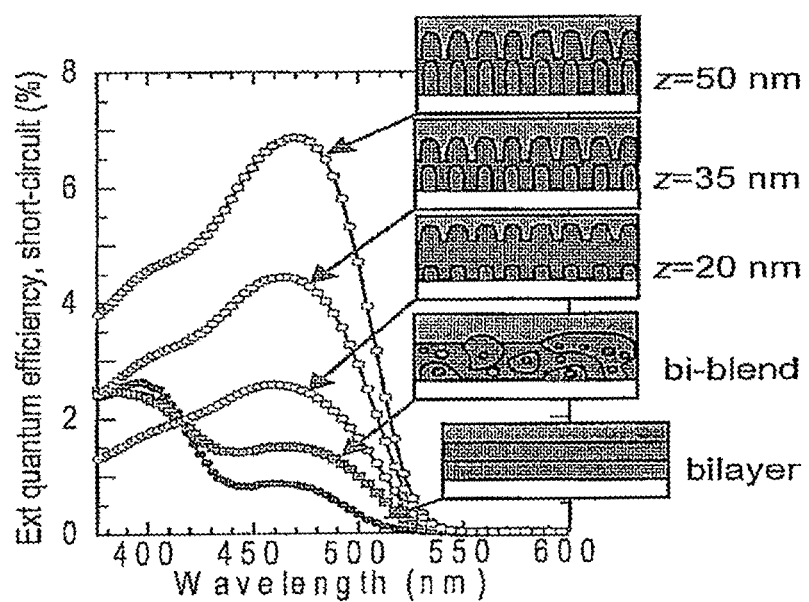
FIG. 2 shows the photovoltaic performance of devices according to the present invention compared to known blended composites.

As can be seen in FIG. 2, in comparison with the bulk distributed heterostructure devices given by the bi-blend of PFB and F8BT (maximum photon to electron conversion efficiency of 1.5% at 475 nm), it is clear that the columnar heterostructures of the present invention give much better performance (up to 7% at the same wavelength) by a factor of greater than 4.5.

In summary, a natural phase separation between polymers or solvent and polymer may be achieved according to the present invention. Tall polymer nanostructures can be built using the layer by layer upon polymer nanotemplate approach. Also a diffuse interface may be achieved according to the present invention. The methods according to the present invention are more easily processable than processes that require lithography. The methods according to the present invention are also solution processable which enables large area production by using techniques such as ink jet printing.

EXAMPLES

Materials

All chemicals and reagents were obtained from Sigma-Aldrich unless otherwise stated. (6,6)-phenyl $C_{61}$-butyric acid methyl ester (PCBM) was obtained from Nano-C.

PFB and F8BT may be obtained, for example, from American Dye Sources.

Test Methods

Quantum Efficiency

External quantum efficiencies were measured in an inert atmosphere or in a vacuum ($10^{-6}$ Torr) using a calibrated system comprising a solar simulator (Oriel), monochromator (Cornerstone) and sourcemeter (Keithley 2400). Short circuit current and open circuit voltage were measured using a semiconductor parametric analyzer (Keithley 4200). Incident light power was measured with a calibrated silicon diode (OPT301M). Quantum efficiencies were obtained as a function of wavelength by comparing the photocurrent output of the device under test with that of a calibrated photodiode. Power conversion efficiencies (PCE) were calculated according to Equation 1:

$$PCE = \frac{\text{Fill Factor} \times Voltage_{(open\ circuit)} \times Current_{(short\ circuit)} \times 100}{\text{Incident Power}} \quad (1)$$

wherein the fill factor is the ratio of the actual maximum obtainable power to the theoretical power, given as a percentage.

Measurement of Nanostructures

The morphology of the nanostructures were measured by atomic force microscopy (Digital Instruments Dimension 3000 atomic force microscope in tapping mode).

All film thicknesses are measured on a Tencor P2 profilometer.

Ellipsometry

Ellipsometry measurements were carried out on a JA Woollam M2000V ellipsometer. Variable angle spectroscopic ellipsometry was measured at both the top and bottom interfaces, wherein the top interface refers to the air-polymer interface and the bottom interface refers to the polymer-glass interface. Del and Psi ellipsometric values were collected as a function of wavelength for angles of 50, 55 and 65 degrees.

Optical modelling was carried out using WVASE32 modelling software. Optical constants n and k were fitted by using the measured thickness.

Example 1a

The polymer poly(9,9'-dioctylfluorene-co-bis-N,N'(4-butylphenyl)-bis-N,N'-phenyl-1,4-phenylene-diamine) PFB with molecular weight ~100,000 is dissolved in toluene at a concentration of 9 mg/ml. Polystyrene (PS) with molecular weight ~10,000 is dissolved in toluene at a concentration of 9 mg/ml. The two solutions are added in equal amounts such that the weight ratio of the two polymers are equal. A photo-crosslinker is added at 6 wt % 12 mm by 12 mm silicon oxide wafers are pre-cleaned with RCA standard clean 1 solution for 15 minutes. The solution is then spin coated onto the wafer at 3000 revolutions per minute (rpm) for 40 seconds. The thickness of the resulting film is ~40 nm. Methyl ethyl ketone (MEK) is dropped onto the film for 10 seconds to selectively remove the polystyrene. The wafer is then spun dry of methyl ethyl ketone with dissolved polystyrene at 3000 rpm for 40 seconds. The remaining polymer PFB reveals a nanostructure with feature sizes in the range of 100 nm to 500 nm, more specifically 300 nm. The PFB layer is then cross-linked by exposing the sample to ultraviolet light (254 nm) for 2 mins under nitrogen at ambient temperature (10 ppm $O_2/H_2O$).

Example 1b

Poly (9,9'-dioctylfluorene-co-bis-N,N'-(4-butylphenyl)-bis-N,N'-phenyl-1,4-phenylene-diamine) PFB with molecular weight ~300,000 gmol$^{-1}$ is dissolved in toluene at a concentration of 9 mg/mL. Polystyrene (PS) with a molecular weight ~10,000 gmol$^{-1}$ is dissolved in toluene at a concentration of 9 mg/mL. PFB is the desired first polymer to be nanostructured and is also the hole acceptor, e.g. for use in a photovoltaic cell. PS is the phase control material. The two solutions are mixed in equal amounts such that the weight ratio of the two polymers is 1:1. Bisazide photo-crosslinker ethylene bis(4-azido-2,3,5-trifluoro-6-isopropylbenzoate) is dissolved in toluene at a concentration of 9 mg/mL and added to the polymer solution mixture at 1 wt % with respect to the total polymer weight.

The solution is spin-coated onto clean ITO-glass substrates pre-coated with a 50 nm thick poly(3,4-ethylenedioxythiophene):poly(styrenesulfonic acid) (PEDT:PSSH) at 3000 revolutions per minute (rpm) for 40 seconds. The thickness of the resultant film is 40 nm. Methyl ethyl ketone (MEK) is dropped onto the film for 10 seconds and spun-off to selectively remove the polystyrene.

The film remaining on the substrate is PFB (with dispersed crosslinker) in-plane nanostructured at a lateral length scale of ~100 nm and thickness of 20 nm.

The nanostructured PFB layer is then cross-linked by exposing the sample to UV light (254 nm) for 2 minutes under a nitrogen atmosphere (<1 ppm $O_2/H_2O$).

Poly((9,9'-dioctylfluorene)-alt-(benzothiadiazole)) (F8BT), the electron accepting material for the photovoltaic cell, is then spun-cast from a 15 mg/mL solution in toluene to give a film thickness of about 50 nm.

After the crosslinking step in the two polymers plus one solvent approach, the same solution of (PFB/PS) is spin coated onto the polymer nanotemplate. The PFB will align to the PFB nanotemplate below. The polystyrene is then selectively removed using MEK. The resulting self-organized polymer nanostructure is rendered insoluble by exposure of The PFB layer can be cross-linked by exposing the sample to ultra-violet light (254 nm) for 2 mins under nitrogen ambient (10 ppm $O_2/H_2O$). Third and subsequent layers can be added by repeating the steps.

Example 1c

As described in the preceding paragraph, in a variation of the method of Example 1b, the steps of deposition of the PFB/PS containing solution, washing with MEK and crosslinking were carried out a second time prior to deposition of the F8BT solution, resulting in a nanostructured PFB layer with a thickness of 35 nm.

Example 1d

In a variation of the method of Example 1b, the steps of deposition of the PFB containing solution, washing with MEK and crosslinking were repeated twice prior to deposition of the F8BT solution, resulting in a nanostructured PFB layer with a thickness of 50 nm.

The external quantum efficiencies of Examples 1b, 1c and 1d are illustrated in FIG. 2.

Example 1e

The polymer poly(9,9'-dioctylfluoreneco-bis-N,N'(4-butylphenyl)-bis-N,N'-phenyl-1,4-phenylene-diamine) PFB with molecular weight ~100,000 is dissolved in toluene at a concentration of 9 mg/ml. Polystyrene (PS) with molecular weight ~10,000 is dissolved in toluene at a concentration of 9 mg/ml. The two solutions are added in equal amounts such that the weight ratio of the two polymers are equal. A photo-crosslinker is added at 6 wt %. 12 mm by 12 mm ITO substrate after 10 min oxygen plasma was span with PEDT:PSSH at 5000 revolutions per minute (rpm) for 40 seconds to give 40 nm thick PEDT:PSSH. The solution is then spin coated onto this PEDT:PSSH film at 3000 rpm for 40 seconds. The thickness of the resulting film is ~40 nm. Methyl ethyl ketone (MEK) is dropped onto the film for 10 seconds to selectively remove the polystyrene. The wafer is then spun dry of methyl ethyl ketone with dissolved polystyrene at 3000 rpm for 40 seconds. The remaining polymer PFB reveals a nanostructure with feature sizes ~100 nm. The PFB layer is then cross-linked by exposing the sample to ultra-violet light (254 nm) for 2 mins under nitrogen ambient (10 ppm $O_2/H_2O$).

Example 1f

The polymer poly [2-methoxy-5-(3',7'-dimethyloctyloxy)]-p-phenylene (OC1C10-PPV) with molecular weight ~400,000 is dissolved in toluene at concentration of 9 mg/ml. Polystyrene (PS) with molecular weight ~40,000 is dissolved in toluene at concentration of 9 mg/ml. The two solutions are added in equal amounts such that the weight ratio of the two polymers are equal. A photo-crosslinker is added at 6 wt %. 12 mm by 12 mm silicon oxide wafers are pre-cleaned with RCA standard clean 1 solution for 15 minutes. The solution is then spin coated onto the wafer at 3000 revolutions per minute (rpm) for 40 seconds. The thickness of the resulting film is ~40 nm. Methyl ethyl ketone (MEK) is dropped onto the film for 10 seconds to selectively remove the polystyrene. The wafer is then spun dry of methyl ethyl ketone with dissolved polystyrene at 3000 rpm for 40 seconds. The remaining polymer PFB reveals a nanostructure with feature sizes ~100 nm. The PFB layer is then cross-linked by exposing the sample to ultra-violet light (254 nm) for 2 mins under nitrogen ambient (10 ppm $O_2/H_2O$).

Example 1g

Polymer poly [2-methoxy-5-(3',7'-dimethyloctyloxy)]-p-phenylene (OC1C10-PPV) with molecular weight ~1,000,000 $gmol^{-1}$ is dissolved in toluene at a concentration of 5 mg/mL. Polystyrene (PS) with molecular weight ~40,000 is dissolved in toluene at a concentration of 9 mg/mL. The two solutions are added in equal amounts such that the weight ratio of the two polymers are equal. Bisazide photo-crosslinker ethylene bis(4-azido-2,3,5-trifluoro-6-isopropylbenzoate) is dissolved in chlorobenzene at a concentration of 9 mg/mL and added to the polymer solution mixture to give 1 wt % with respect to the total polymer weight. The remaining steps are identical to those in Example 1b.

Example 1h

Polymer poly [2-methoxy-5-(3',7'-dimethyloctyloxy)]-p-phenylene (OC1C10-PPV) with molecular weight ~100,000 is dissolved in toluene at concentration of 9 mg/ml. Polystyrene (PS) with molecular weight ~10,000 is dissolved in toluene at concentration of 9 mg/ml. The two solutions are added in equal amounts such that the weight ratio of the two polymers are equal. A photo-crosslinker is added at 6 wt %. 12 mm by 12 mm ITO substrate after 10 min oxygen plasma was spun with PEDT:PSSH at 5000 revolutions per minute (rpm) for 40 seconds to give 40 nm thick PEDT:PSSH. The solution is then spin coated onto this PEDT:PSSH film at 3000 rpm for 40 seconds. The thickness of the resulting film is ~40 nm. Methyl ethyl ketone (MEK) is dropped onto the film for 10 seconds to selectively remove the polystyrene. The wafer is then spun dry of methyl ethyl ketone with dissolved polystyrene at 3000 rpm for 40 seconds. The remaining polymer PFB reveals a nanostructure with feature sizes ~100 nm-500 nm. The PFB layer is then cross-linked by exposing the sample to ultra-violet light (254 nm) for 2 mins under nitrogen ambient (10 ppm $O_2/H_2O$).

Example 2a

The polymer poly(9,9'-dioctylfluoreneco-bis-N,N'-(4-butylphenyl)-bis-N,N'-phenyl-1,4-phenylene-diamine) PFB with molecular weight ~100,000 is dissolved in toluene at a concentration of 9 mg/ml. 6 wt % of a photo-crosslinker is added next. A dissimilar solvent (dimethylformamide) which has low entropy to PFB is added at 5 vol %. The solution is spin coated onto pre-cleaned silicon oxide wafers at 3000 rpm at 40 seconds. PFB is naturally phase separated with length scales in the order of a few micrometers. The PFB layer can be cross-linked by exposing the sample to ultra-violet light (254 nm) for 2 mins under nitrogen ambient (10 ppm $O_2/H_2O$).

Tall polymer nanostructures can also be built using the one polymer and two solvent approach as the nanotemplate layer and subsequent layers can be built using either the two polymer one solvent or one polymer two solvent approach.

Example 3a

Polymer poly [2-methoxy-5-(3',7'-dimethyloctyloxy)]-p-phenylene (OC1C10-PPV) with molecular weight 100,000 is dissolved in toluene at a concentration of 9 mg/ml. 6 wt % of a photo-crosslinker is added next. The solution is spin coated onto pre-cleaned silicon oxide wafers at 3000 rpm at 40 seconds to give a 55 nm thick film. The OC1C10-PPV layer can be cross-linked by exposing the sample to ultra-violet light (254 nm) for 2 mins under nitrogen ambient (10 ppm $O_2/H_2O$). (6,6)-phenyl $C_{61}$-butyric acid methyl ester (PCBM) with molecular weight ~910.9 is dissolved in chlorobenzene. PCBM is spin-coated twice onto OC1C10-PPV layer at 3000 rpm at 40 seconds to give a 35 nm thick OC1C10-PPV/14 nm PCBM.

Example 3b

Polymer poly [2-methoxy-5-(3',7'-dimethyloctyloxy)]-p-phenylene (OC1C10-PPV) with molecular weight 100,000 is dissolved in toluene at a concentration of 9 mg/ml. 6 wt % of a photo-crosslinker is added next. The solution is spin coated onto 40 nm thick PEDT:PSSH at 3000 rpm at 40 seconds to give a 55 nm thick film. The OC1C10-PPV layer can be cross-linked by exposing the sample to ultra-violet light (254 nm) for 2 mins under nitrogen ambient (10 ppm $O_2/H_2O$). (6,6)-phenyl $C_{61}$-butyric acid methyl ester (PCBM) with molecular weight ~910.9 is dissolved in chlorobenzene. PCBM is spin-coated twice onto OC1C10-PPV layer at 3000 rpm at 40 seconds to give a 35 nm thick OC1C10-PPV/14 nm PCBM.

Example 3c

Polymer poly [2-methoxy-5-(3',7'-dimethyloctyloxy)]-p-phenylene (OC1C10-PPV) with molecular weight 100,000 is dissolved in toluene at a concentration of 9 mg/ml. 6 wt % of a photo-crosslinker is added next. The solution is spin coated onto 40 nm thick PEDT:PSSH at 3000 rpm at 40 seconds to give a 55 nm thick film. The OC1C10-PPV layer can be cross-linked by exposing the sample to ultra-violet light (254 nm) for 2 mins under nitrogen ambient (10 ppm $O_2/H_2O$). (6,6)-phenyl $C_{61}$-butyric acid methyl ester (PCBM) with molecular weight ~910.9 is dissolved in chlorobenzene to give final concentrations between 0.1 mg/mL and 10 mg/mL. The PCBM solution is inkjet-printed over the crosslinked (OC1C10-PPV) over multiple passes to give a layer of (OC1C10-PPV) of approximately 35 nm in thickness on top of which is deposited a layer of PCBM of approximately 30 nm thickness.

Example 3d

Poly [2-methoxy-5-(3',7'-dimethyloctyloxy)]-p-phenylene (OC1C10-PPV) with molecular weight 1,000,000 $gmol^{-1}$ was dissolved in toluene at a concentration of 3 mg/mL. Bisazide photo-crosslinker ethylene bis(4-azido-2,3,5-trifluoro-6-isopropylbenzoate) was added to the mixture to give a final crosslinker concentration of 0.5 w/w % with respect to the $OC_1C_{10}$-PPV. This solution was then spin coated onto clean ITO-glass substrate pre-coated with a 50 nm thick PEDT:PSSH film at 3000 rpm for 40 seconds to give a 55 nm thick film.

The $OC_1C_{10}$-PPV layer was then crosslinked by exposing to UV light (254 nm) for 2 minutes under a nitrogen atmosphere (<1 ppm $O_2/H_2O$) and rinsed with toluene on the spinner. (6,6)-phenyl $C_{61}$ butyric acid methyl ester (PCBM) (molecular weight 910.9 g $mol^{-1}$) was dissolved in chlorobenzene to a concentration of 9 mg/mL. PCBM was then infiltrated into the polymer layer by spinning at 3000 rpm for 40 seconds.

In this example, the PCBM is the electron acceptor and electron transporter, while the $OC_1C_{10}$-PPV is the hole acceptor and hole transporter of the photovoltaic cell. The primary light absorber is $OC_1C_{10}$-PPV, which has an absorption coefficient five times greater than that of PCBM at wavelengths between 450 and 550 nm.

Figure 3:
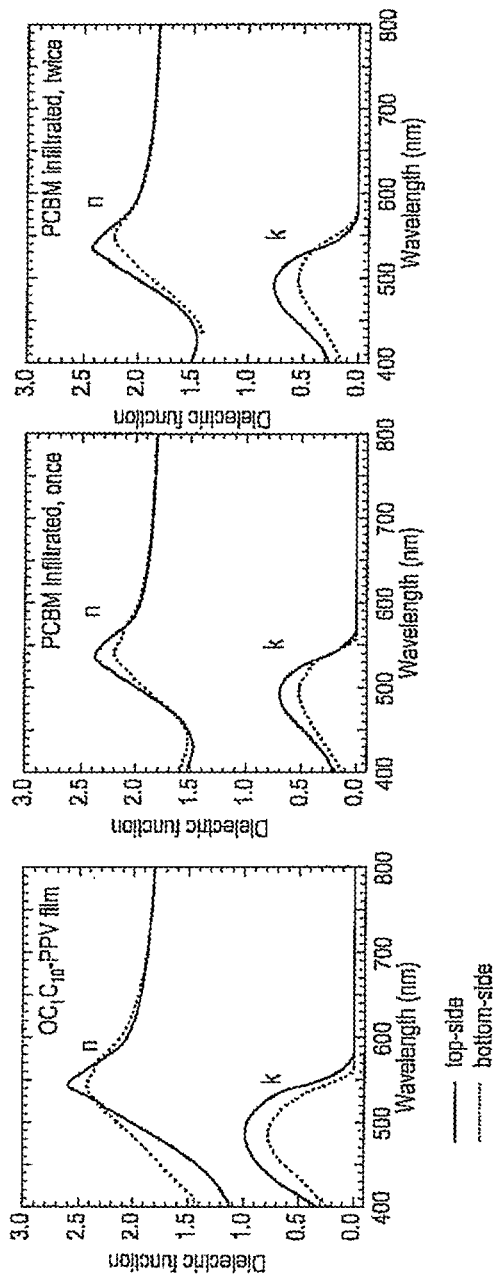
FIG. 3 shows the dielectric function of a composition formed in accordance with the fourth aspect of the present invention.

Infiltration of PCBM into the $OC_1C_{10}$-PPV film results in a diffuse interface and a graded composition, as confirmed by top-side and bottom-side spectroscopic ellipsometry, the results of which are shown in FIG. 3. The dielectric function determined from the top-side (air-polymer) shows a higher PCBM content compared to the bottom-side (polymer-substrate). This can be seen from the relatively higher k values at wavelengths below 450 nm, where the $OC_1C_{10}$-PPV absorption tails off and the strong absorption band of PCBM begins. The ellipsometry results also suggest the possible presence of a thin layer of PCBM (about 3 nm) on the surface of the graded composite film.

Optical modeling suggests that the average PCBM: $OC_1C_{10}$-PPV volume ratio in the film is between 0.5:1 to 1:1 with slightly higher PCBM content at the top (air-polymer) interface than at the bottom.

Example 3e

Following infiltration of PCBM in Example 3c, an aluminium metal cathode was deposited onto the heterostructure to give a photodiode pixel.

Semiconductor devices made from such heterostructures exhibit higher efficiencies than conventional blend devices.

The invention claimed is:

1. A method of making a supported heterostructure comprising a diffuse interface, the method comprising or including the steps of:
    i) depositing on a substrate a first polymer;
    ii) crosslinking the first polymer on the substrate after deposition; and
    iii) depositing on the first polymer a further material with lower molecular weight than the molecular weight of the first polymer, wherein the further material diffuses into the first polymer.

2. The method of claim 1, wherein the lower molecular weight material comprises an oligomer.

3. The method of claim 2, wherein the oligomer comprises an oligomer of thiophene, phenylene, fluorene or oxadiazole.

4. The method of claim 1, wherein the lower molecular weight material comprises a small molecule.

5. The method of claim 4, wherein the small molecule comprises fullerene or a derivative thereof.

6. The method of claim 1, wherein the lower molecular weight material comprises one or more nanocrystals or nanowires.

7. The method of claim 1, wherein the substrate is pre-patterned.

8. The method of claim 1, comprising the further steps of incorporating the supported heterostructure in a semiconductor device.

9. The method according to claim 1, wherein the device is a photovoltaic device.

10. The method according to claim 1, wherein the device is a light-emitting diode.

* * * * *